United States Patent [19]
Ishii

[11] Patent Number: 6,157,421
[45] Date of Patent: Dec. 5, 2000

[54] LIQUID CRYSTAL DISPLAY AND METHOD OF MANUFACTURING THE SAME

[75] Inventor: Takayuki Ishii, Hiratsuka, Japan

[73] Assignee: Canon Kabushiki Kaisha, Tokyo, Japan

[21] Appl. No.: 08/569,058

[22] Filed: Dec. 8, 1995

[30] Foreign Application Priority Data

Dec. 12, 1994 [JP] Japan ..................................... 6-307490

[51] Int. Cl.⁷ .......................... G02F 1/136; G02F 1/1343; G02F 1/1345
[52] U.S. Cl. .............................. 349/43; 349/42; 349/140; 349/143; 349/151; 257/67; 257/72
[58] Field of Search ................................ 257/67, 72, 59; 349/42, 151, 43, 140, 143

[56] References Cited

U.S. PATENT DOCUMENTS

| 4,461,670 | 7/1984 | Celler et al. .............................. 117/54 |
| 4,772,927 | 9/1988 | Saito et al. .................................. 257/67 |
| 4,838,654 | 6/1989 | Hamaguchi et al. ....................... 349/45 |
| 5,172,203 | 12/1992 | Hayashi ..................................... 257/67 |
| 5,412,240 | 5/1995 | Inoue et al. ................................ 349/43 |
| 5,574,292 | 11/1996 | Takahashi et al. ......................... 257/59 |

*Primary Examiner*—William L. Sikes
*Assistant Examiner*—Julie Ngo
*Attorney, Agent, or Firm*—Fitzpatrick, Cella, Harper & Scinto

[57] ABSTRACT

A liquid crystal display is disclosed having switching devices corresponding to pixel electrodes formed on the same semiconductor layer that has a drive circuit therein. The drive circuit is formed on the semiconductor layer in a single crystal semiconductor region and the switching devices are formed either in a second single crystal semiconductor region or in a non-single crystal semiconductor region. The second single crystal semiconductor region or the non-single crystal semiconductor region bearing the switching devices has a higher density of defects than the first semiconductor region.

14 Claims, 11 Drawing Sheets

PRIOR ART

LIQUID CRYSTAL DISPLAY AND METHOD OF MANUFACTURING THE SAME

BACKGROUND OF THE INVENTION

1. Field of the Invention

The present invention relates to a liquid crystal display provided with an active matrix circuit substrate, which is applicable for high-definition television sets, electronic viewfinders for use in a combination camera/VTR system, head mount displays, projection television sets, and the like. The invention also relates to a method of manufacturing the above-described liquid crystal display.

2. Description of the Related Art

Hitherto, many studies have been made of active matrix liquid crystal displays for use in flat panel displays or projection television sets, resulting in some devices which have been commercially available. Such liquid crystal displays utilize a substrate with high density switching devices in a two-dimensional matrix. One example of such a conventional active matrix liquid crystal display is schematically shown in FIG. 11.

Figure 11:
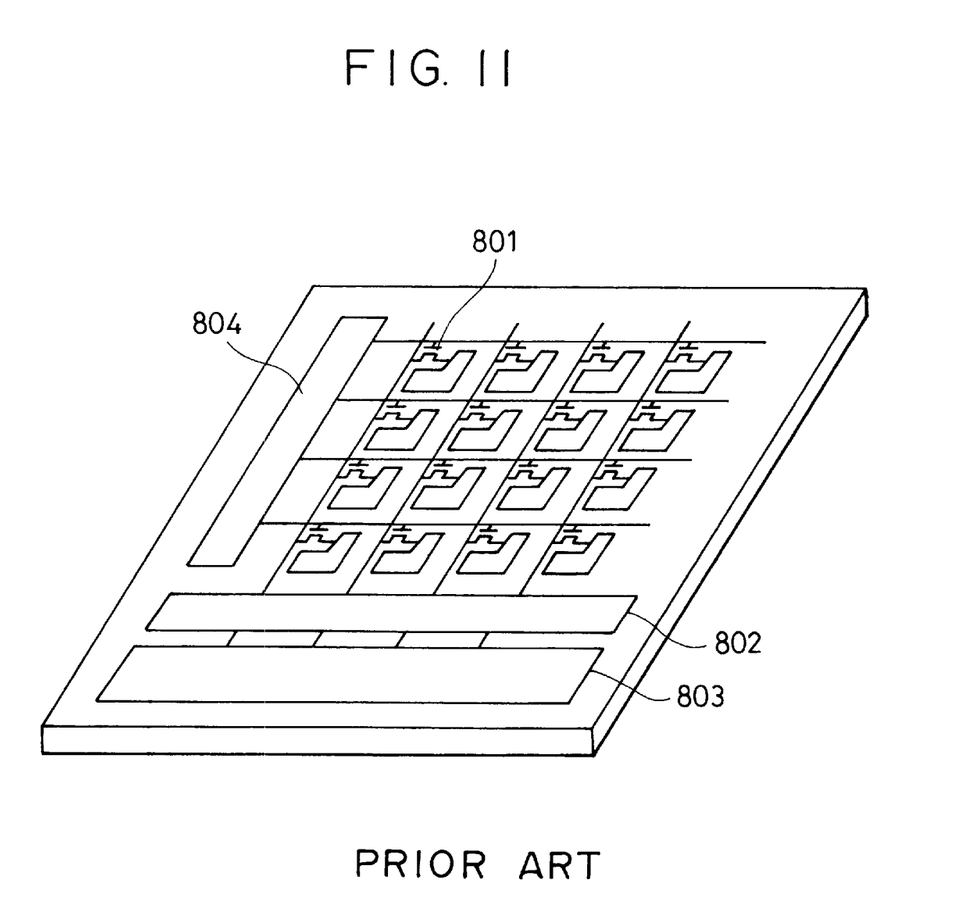
FIG. 11 is a schematic view illustrating one example of a conventional liquid crystal display.

Referring to FIG. 11, the liquid crystal display includes transistor pixel switches 801, a buffer 802, a horizontal shift register 803, and a vertical shift register 804. Television luminance signals and sound signals are compressed into a desired frequency band, and the compressed signals are then sent to the buffer 802. The buffer 802 is driven to follow the frequencies by the horizontal shift register 803.

The signals sent to buffer 802 are transferred to pixel electrodes connected to the transistor drains while the pixel switches 801 remain in the on state by the vertical shift register 804.

Features required for circuits that constitute this panel when the above-described panel is used for a high-definition television set (HDTV) will now be considered. Television signals are transferred to the buffer at a frequency of approximately 45 MHz under the conditions that a frame frequency is 60 Hz; the number of scanning lines is approximately 1000; a horizontal scanning period is approximately 30 μsec (effective scanning period is 27 μsec); and the number of horizontal pixels is approximately 1500. The period required for signal transfer per scanning line ranges from 1 to 2 μsec. In consideration of the above, the following four features are required for each circuit:

(1) Possessing a driving power of 45 MHz or higher of the horizontal shift register;

(2) Possessing a driving power of 500 kHz or higher of the vertical shift register;

(3) Possessing a driving power of 45 MHz or higher of a transfer switch that is driven by the horizontal shift register and is used for transferring television signals to the buffer; and (4) Possessing a driving power of 500 kHz or higher by a pixel switch.

The driving power referred above is a signal transfer capability determined as follows. When a certain gradation number N is transmitted to liquid crystal pixels, the signal transfer capability should not be larger than $(V_m-V_t)/N[V]$ during the previously-described period per scanning line with respect to all the pixels scanned by the scanning line, wherein $V_m$ indicates a voltage that will provide maximum or minimum transmittance of the liquid crystal; and $V_t$ designates a threshold voltage of the liquid crystal obtained from a V-T (voltage-transmittance) curve.

The above four features illustrate that the driving powers of the pixel switches and the vertical shift register may be small, while high-speed driving powers are required for the horizontal shift register and the buffer. Accordingly, in typical liquid crystal displays, the pixel switches and the vertical shift register are constructed in a monolithic structure of non-single crystal thin film transistors (TFTs) formed of polycrystal silicon, amorphous silicon or the like, while peripheral circuits are formed of IC chips mounted on the exterior.

Attempts have been made to construct the peripheral circuit in the form of a monolithic structure with the pixel switches and the vertical shift register. However, this requires that complicated modifications, such as increasing the size of the transistors, should be made to the circuit, since the driving powers of the individual TFTs are very small.

Meanwhile, attention is being focused on TFTs as a component used for a three-dimensional integrated circuit, a contact sensor or the like, formed in a single crystal silicon layer disposed on an insulating substrate (SOI). The TFTs formed into the SOI substrate have superior characteristics, such as a smaller parasitic capacity, better dielectric separation for preventing the latch-up state, and higher resistance to radiation, in comparison with transistors formed on a conventional single crystal silicon wafer. Based on this fact, many studies are being made of such TFTs based on the assumption that the thickness of a single crystal silicon layer is sufficiently reduced (formed into a super thin film), and transistors are formed in the thin layer. This arrangement may improve characteristics of the transistors, such as higher carrier mobility, better sub-threshold characteristics and the like by virtue of the mechanism inherent in the transistors.

However, super thin-film transistors encounter problems in that there is a sharp deterioration in the drain's resistance to voltages when the gate voltage $V_g$ is zero [V] (in the off state) in accordance with the reduced film thickness. This problem seriously hampers the further development of transistors for applications, which are required to resist higher voltages, such as contact sensors, plane displays and the like.

This problem arises from a floating structure inherent in an insulating substrate having a single crystal silicon layer. This will be explained in greater detail with reference to an N-channel MOSTFT by way of example.

When a bias is applied between the gate and the drain of the transistor, lines of electric force extend in a range from an end of a gate electrode to an end of a drain electrode. Simultaneously, a region having a very high density of an electric field is formed in a drain-channel junction. This electric field particularly concentrates on the interface between the above-mentioned junction and the gate insulating film. Electrons that have been supplied from the source region and have reached the end of the drain are further accelerated by this electric field so as to cause impact ionization in a depletion layer at the drain-channel junction, thus generating holes.

These holes move to the end of the source and are removed from the source electrode. However, as a large amount of holes are generated, they are not removed from the source region and, instead, accumulate in the channel region. As a result, the accumulated holes disadvantageously lower the potential of the channel, which further causes the supply of a larger amount of electrons to the end of the drain. The electrons supplied to the drain once again bring about impact ionization, thus causing additional accumulation of holes in the channel.

In this manner, a positive feedback is provided for a series of operations, such as the concentration of an electric field, the generation of impact ionization and the accumulation of holes. During this process, when the transistor is in the off state, electrons that cause impact ionization are supplied by the generation of a reverse-biased current at the drain-channel junction.

P-channel MOSFETs have substantially the same problem as the N-channel MOSFETs discussed above, although in the former the majority carrier is holes, which have a lower impact ionization rate than that of electrons, such that a smaller adverse influence is produced.

One possible solution to this problem is to quickly remove carriers (holes for N-channel MOSFETs, and electrons for P-channel MOSFETs) from the channel before they accumulate. One method to achieve this is to maintain the potential of the channel (hereinafter referred to as the "SUB potential") at a given potential level, as viewed in the normal IC structure.

However, this method necessitates a region used for extracting the SUB potential, thus increasing the area of the device. This hampers the integration of devices, and further causes a reduction in the aperture efficiency of pixels for the application of the transistor to a switching transistor of a liquid crystal device. These deficiencies are addressed by the present invention.

SUMMARY OF THE INVENTION

It is an object of the present invention to provide a liquid crystal display which performs a high speed driving operation compatible with high definition television sets and the like. Another object of the present invention is to provide a liquid crystal display which prevents an adverse influence produced by a leakage current caused by the entry of light into TFTs.

The present invention has been accomplished after a close study to solve the previously discussed technical problems. The present invention is constructed as follows.

These objects and others are achieved by the present invention which provides a liquid crystal display comprising: an active matrix circuit substrate with a plurality of switching devices in the form of a matrix corresponding to a plurality of pixel electrodes, and a drive circuit for driving the switching devices; an opposing substrate provided with electrodes opposite facing the pixel electrodes; and liquid crystal sealed between the active matrix circuit substrate and the opposing substrate, wherein the switching devices are formed on the same single crystal semiconductor layer that constitutes a first semiconductor region having the drive circuit therein, the switching devices also being formed in a second semiconductor region, the second semiconductor region being a single crystal or a non-single crystal semiconductor region, the second semiconductor region having a higher defect density than the first single crystal semiconductor region.

The invention also provides a method of manufacturing such a liquid crystal display.

In the liquid crystal display of the present invention, the switching devices corresponding to the pixel electrodes are formed in a single crystal semiconductor region or in a non-single crystal semiconductor region, which regions have a higher density of defects, in comparison with switching devices formed in a single crystal region of good quality having a lower defect density. In switching devices formed of thin film transistors, the minority carrier generated by impact ionization are trapped due to defects in the semiconductor region, thus shortening the lifetime of the minority carrier and further inhibiting a reduction in resistance to voltages. Further, current leakage caused by entry of light to the thin film transistors can also be inhibited.

The present invention also offers further advantages as follows. It is not necessary to provide a region for extracting a SUB potential and removing the minority carrier from the channel region, thus improving the aperture efficiency of pixels. The single crystal region having a drive circuit and the semiconductor region having the switching devices are formed on the same semiconductor layer, whereby both regions can be constructed in a compact monolithic structure. The higher power drive circuit is formed in the single crystal semiconductor :region having a lower defect density, while the switching devices corresponding to the pixel electrodes are formed in a higher defect density region of a single crystal semiconductor or a non-single crystal semiconductor. With this construction, it is possible to most effectively exhibit the functions required of the respective drive circuit and the switching devices, thereby enabling stable display of excellent images.

The above-described liquid crystal display can be suitably manufactured according to the method of the present invention. In this method, the switching devices corresponding to the pixel electrodes are formed on the same semiconductor layer that constitutes the semiconductor region having a drive circuit. With this arrangement, the drive circuit and the switching devices can be formed in a monolithic structure on the same substrate.

Further objects, features and advantages of the present invention will become apparent from the following description of the preferred embodiments with reference to the attached drawings.

BRIEF DESCRIPTION OF THE DRAWINGS

FIGS. 1(*a*)–(*e*) are schematic views illustrating a manufacturing method of a liquid crystal display according to the present invention;

FIGS. 3(*a*) and (*b*) are schematic views illustrating a manufacturing method of a liquid crystal display according to the present invention;

FIGS. 4(*a*)–(*c*) are schematic views illustrating a manufacturing method of a liquid crystal display according to the present invention;

FIGS. 5(*a*) and (*b*) are schematic views illustrating a manufacturing method of a liquid crystal display according to the present invention;

FIGS. 6(*a*)–(*e*) are schematic views illustrating a manufacturing method of a liquid crystal display according to the present invention;

FIGS. 7(*a*)–(*f*) are schematic views illustrating a manufacturing method of a liquid crystal display according to the present invention;

FIGS. 8(*a*)–(*e*) are schematic views illustrating a manufacturing method of a liquid crystal display according to the present invention;

FIGS. 9(*a*)–(*c*) are schematic views illustrating a manufacturing method of a liquid crystal display according to the present invention;

FIGS. 10(*a*) and (*b*) are schematic views illustrating a manufacturing method of a liquid crystal display according to the present invention.

DETAILED DESCRIPTION OF THE PREFERRED EMBODIMENTS

The liquid crystal display according to the present invention has been described in the Summary of the Invention. A description will now be given of the specific methods of forming switching devices corresponding to pixel electrodes. Namely, the switching devices are formed based on the same semiconductor layer that constitutes a single crystal semiconductor region having a drive circuit therein and are also formed in another single crystal semiconductor region (or in a non-single crystal semiconductor region), which has a higher density of defects than the former single crystal semiconductor region. Before the switching devices are formed, a single crystal semiconductor region which has a lower density of defects and which is large enough to form a drive circuit and switching devices corresponding to pixel electrodes therein is prepared. The defect density of the region in which switching devices will be formed is then increased.

The defect density of the single crystal semiconductor region may be increased according to any suitable method, such as an ion implantation method, the so-called "stress" method (in which a physical stress is applied to the semiconductor surface), a thermal stress method, a melting method and the like.

Among these, the ion implantation method is preferable because the single crystal semiconductor region can be amorphized by controlling the defect density. Also, ion implantation makes it possible to differentiate the chemical composition of a region in which a drive circuit will be formed from that of a region in which the switching devices will be formed. Types of ion elements to be implanted are not restricted, but may be ions of elements which form the single crystal semiconductor region and ions of other types of elements including noble gases, such as argon, oxygen, nitrogen and the like.

When silicon is used for a single crystal. semiconductor and $Si^+$ is employed for implantation ions, the amount of $Si^+$ implanted is suitably determined in consideration of the value of the defect density, the structure of the semiconductor region in which switching devices corresponding to the pixels are formed, and other factors as readily determined by the skilled artisan.

In this invention, when silicon is used for a semiconductor, the defect density of a single crystal semiconductor region in which a drive circuit will be formed generally ranges from $1/cm^2$ to $10^8/cm^2$, and more preferably, $1/cm^2$ to $10^5/cm^2$. On the other hand, the higher defect density of a single crystal semiconductor region in which switching devices will be formed generally ranges from $10^9/cm^2$ to $10^{14}/cm^2$, and more preferably, $10^{10}/cm^2$ to $10^{12}/cm^2$.

In this invention, non-single crystal semiconductors include typical polycrystal semiconductors and amorphous semiconductors.

In the liquid crystal display of the present invention, if single crystal silicon is used for a single crystal semiconductor layer in which a drive circuit and switching devices will be formed, an increased operating voltage of TFTs formed in the single crystal silicon layer requires that the thickness of the layer be increased in order to ensure adequate resistance to voltage. More specifically, if the TFTs are used in a display that is subjected to an operating voltage VD at 10V or higher, the layer should be approximately from 4000 to 5000 Å thick.

In contrast, if non-single crystal silicon is used for a region in which switching devices corresponding to pixel electrodes will be formed, resistance to voltages may be sufficiently ensured even if the non-single crystal silicon layer has a smaller thickness. Additionally, since this region is used as a display section, a silicon layer having a smaller thickness is less influenced by a leakage current caused by the entry of light to the pixel TFTs. Thus, the thickness of the region of the non-single crystal silicon layer desirably ranges from 100 to 1000 Å, and more preferably, from 100 to 500 Å.

Although the present invention will be described in greater detail with reference to specific embodiments, it is understood that the invention is not restricted thereto. On the contrary, the invention encompasses features that may readily be changed as long as the objects of the invention can be fulfilled.

EXAMPLE 1

Figure 2:
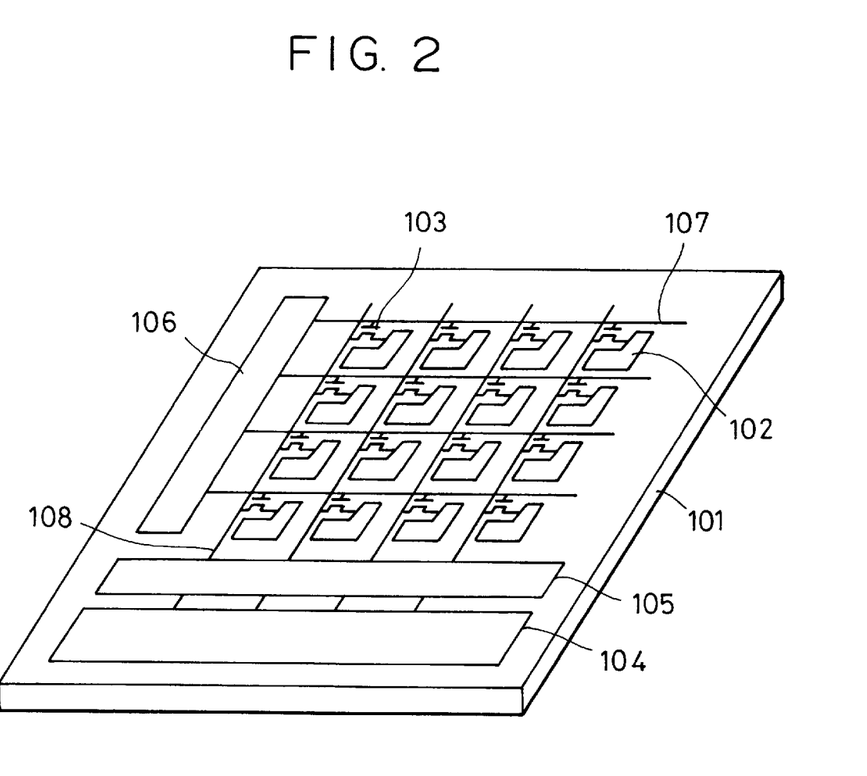
FIG. 2 illustrates one example of a liquid crystal display according to the present invention.

FIG. 2 is a schematic view of a liquid crystal display which includes an insulating substrate 101, pixel electrodes 102, switching devices 103 corresponding to pixel electrodes, which are transistors 103 in this embodiment, a horizontal shift register 104, a buffer 105, a vertical shift register 106, scanning lines 107, and signal lines 108.

In this embodiment, the switching devices 103 were each formed of a polycrystal silicon thin film transistor (TFT). A peripheral drive circuit (comprising the horizontal shift register 104, the buffer 105 and the vertical shift register 106) was formed of a single crystal silicon TFT. A method of manufacturing the liquid crystal display in this embodiment will now be explained with reference to FIG. 1.

Figure 1A:
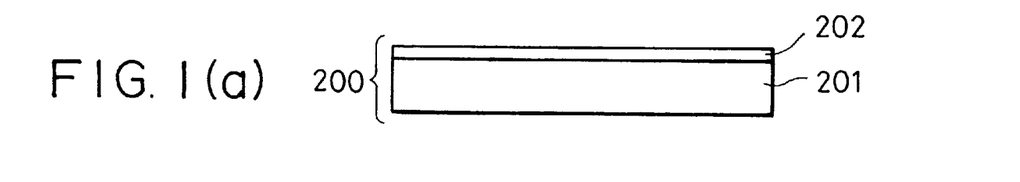
Figure 1B:
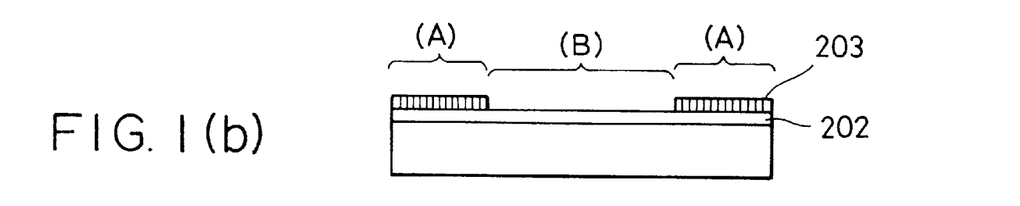
Figure 1C:
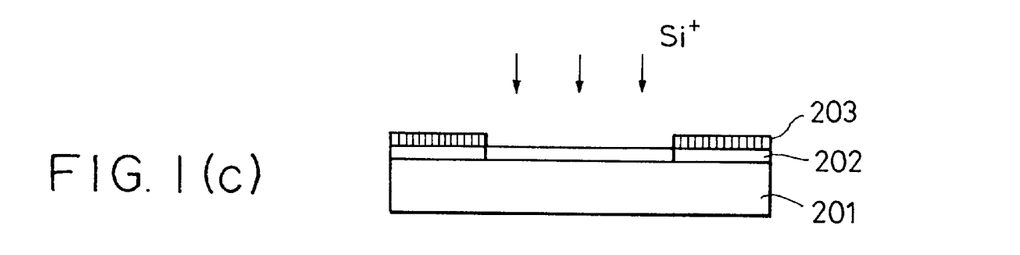
Figure 1D:
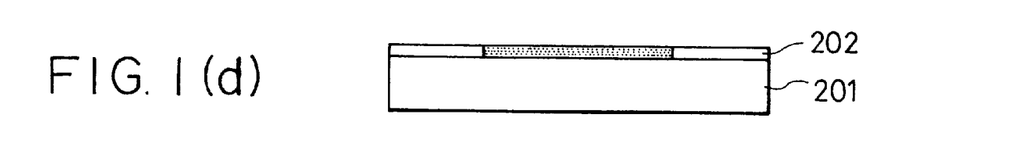
Figure 1E:
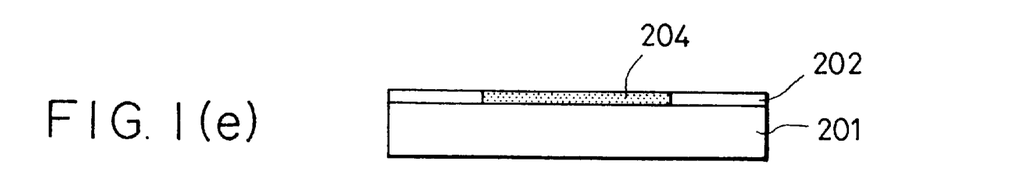

A single crystal region and a polycrystal region were formed on the insulating substrate 201, and transistors were then formed into the regions, resulting in the formation of an active matrix substrate.

A single crystal silicon layer 202 was formed on a quartz substrate 201 according to an ordinary laminating and etching technique. An insulating (SOI) substrate 200 was thus formed (FIG. 1(a)). The thickness of the single crystal silicon layer 202 was controlled to 4000 Å by means of polishing. Then, a resist 203 was applied to the insulating substrate 200 and was partially removed by means of patterning so as to provide an opening for a region (B) to be formed into a polycrystal structure (FIG. 1(b)). The substrate 200 was then installed in an ion implantation apparatus, and $Si^+$ ions in the amount of $5\times10^{15}/cm^2$ were implanted in and around the opening at an acceleration energy of 100 KeV (FIG. 1(c)).

A considerable amount of defects are produced in the region (B) that has been implanted with $Si^+$ ions due to the bombardment of $Si^+$ions, and the degree of defects is increased according to the implantation amount of $Si^+$ ions. If the thickness of the single crystal silicon layer 202 is 4000 Å or smaller, the single crystal silicon layer 202 is transformed into an amorphous silicon layer by implanting the above-described quantity of $Si^+$ ions (FIG. 1(d)). The quantity of implanting $Si^+$ ions is changed depending on the thickness of the single crystal silicon layer so that the layer can be transformed into an amorphous silicon layer.

After the single crystal silicon layer 202 had been amorphized, the resulting silicon layer was annealed at a temperature of 600° C. in a $N^2$ atmosphere for 50 hours. As a result, a polycrystal silicon film 204 having a grain size of a few thousand Å was formed in the non-single crystal region (B) (FIG. 1(e)). The defects generated in part of the non-single crystal region of the silicon layer that was not amorphized were reduced in this annealing process. It is further possible to optimally control the amount of defects in the non-single crystal layer by making adjustments to the annealing temperature and time. The annealing process may be performed according to a method other than heat treatment in an annealing furnace, for example, by a laser annealing method in which case similar advantages may be obtained.

In the manner described above, circuits were constructed in the single crystal region (A) and the polycrystal region (B) formed on the same substrate according to a typical process of forming MOSFETs, thus resulting in the formation of an active matrix substrate. A liquid crystal display was produced by use of this substrate.

Subsequent processes will be explained with reference to FIGS. 3 to 5.

Figure 3A:
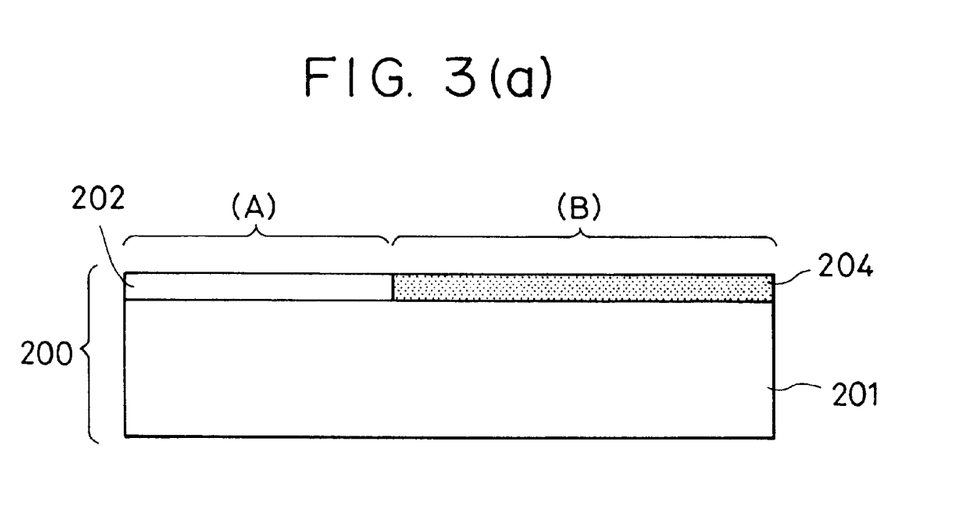
Figure 3B:
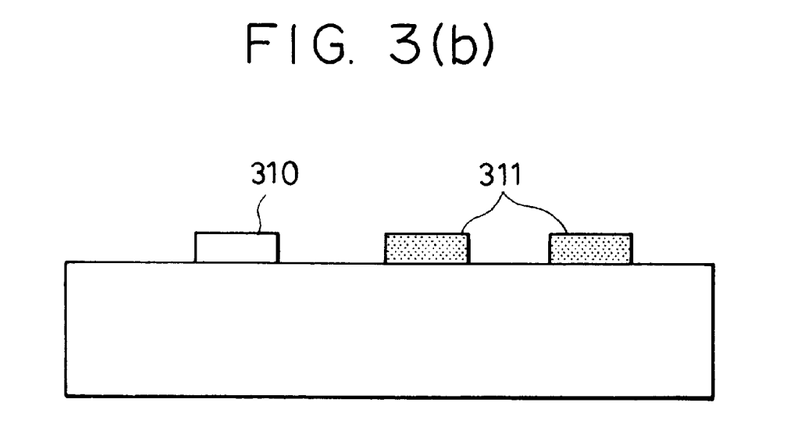

Ion implantation was first conducted on the substrate 200 shown in FIG. 3(*a*) having the single crystal silicon layer region (A) and the non-single crystal silicon region (B) formed therein.

More specifically, for the formation of a well, boron B in the amount of $4\times10^{11}/cm^2$ was implanted into the portion of the single crystal silicon region 202 in which an n-MOS transistor would be formed. On the other hand, phosphorous P in the amount of $2\times10^{11}/cm^2$ was implanted into the portion of the single crystal silicon region 202 in which a p-MOS transistor would be formed. Further, phosphorous P in the amount of $10^{12}/cm^2$ used as an impurity required for forming a channel was implanted into the polycrystal region 204.

Subsequently, the single crystal silicon region 202 and the polycrystal silicon region 204 were partially removed by means of dry etching so that portions 310 and 311 required for forming TFTs were left isolated in an island-like manner (FIG. 3(*b*)).

Figure 4A:
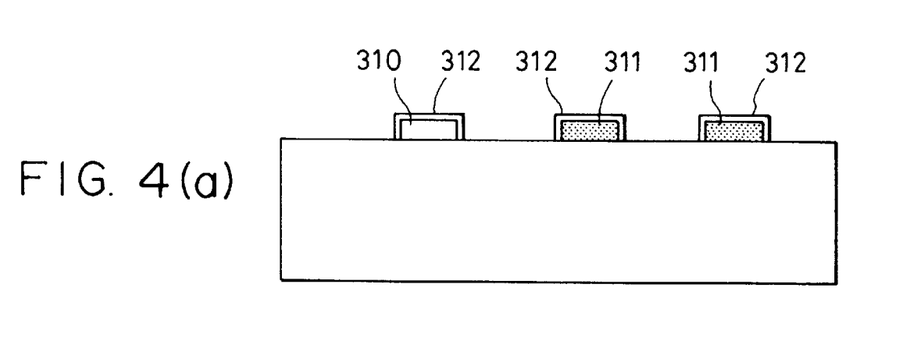
Figure 4B:
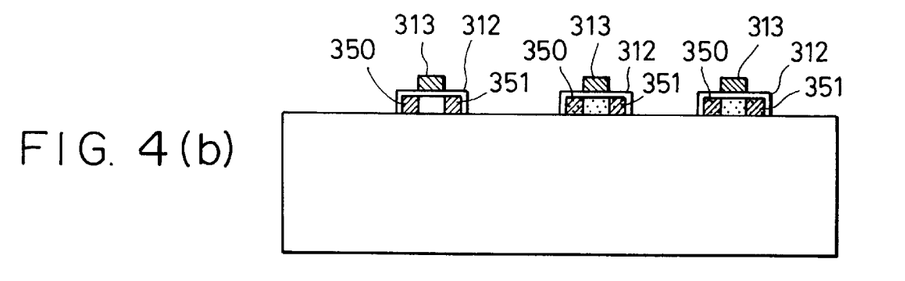

Silicon was oxidized on the surfaces of the isolated single crystal silicon regions 310 and the polycrystal silicon regions 311 so as to form gate insulating films 312 having a thickness of 500 Å (FIG. 4(*a*)).

Polycrystal silicon films were deposited according to a reduced-pressure CVD process so that the thickness would be 4000 Å, and TFT gate electrodes 313 were formed by use of anisotropic etching. Thereafter, source and drain regions were formed in a self-matching manner according to an ion implantation process. More specifically, arsenic (As) ions in the amount of $1\times10^{16}/cm^2$ and $BF_2$ ions in the amount of $2\times10^{15}/cm^2$ were implanted for forming n-MOS transistors and p-MOS transistors, respectively, with the result that source regions 350 and drain regions 351 were formed (FIG. 4(*b*)).

The process of forming the single crystal silicon layer and the polycrystal silicon layer in an isolated and island-like manner discussed above may be carried out by use of a technique of separating silicon layers by masking a silicon layer used for TFTs with a silicon nitride layer and by oxidizing the other silicon layer.

For increasing performance of the non-single crystal silicon TFTs, the following process may be further included: a resist with an opening may be formed only on the non-single crystal silicon regions and then exposed to a hydrogen plasma, thereby reducing the amount of defects in the non-single crystal silicon.

Figure 4C:
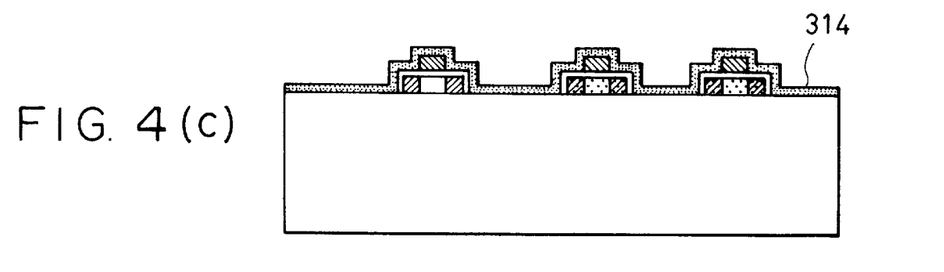

An NSG (Non-doped Silicate Glass) layer 314 was deposited on the thus-prepared transistors according to a normal-pressure CVD process so that the thickness of the layer 314 would be 5000 Å (FIG. 4(*c*)). Subsequently, contact holes were provided for part of the NSG 314, i.e., on the source and drain regions and on the gate electrodes.

Figure 5A:
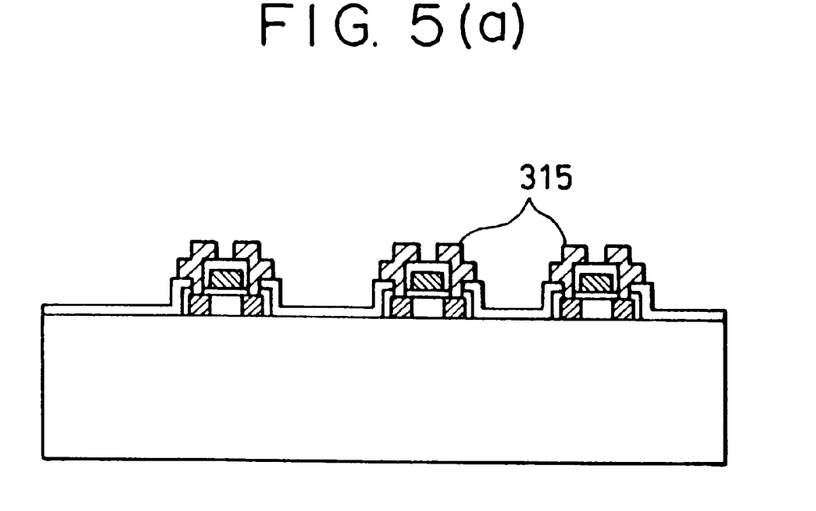
Figure 5B:
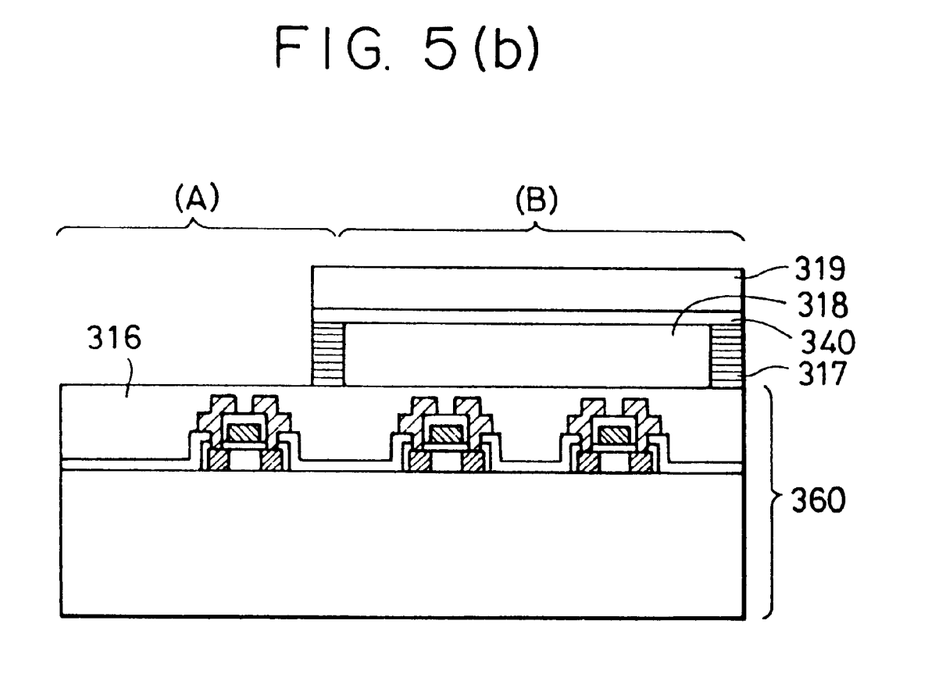
Figure 6A:
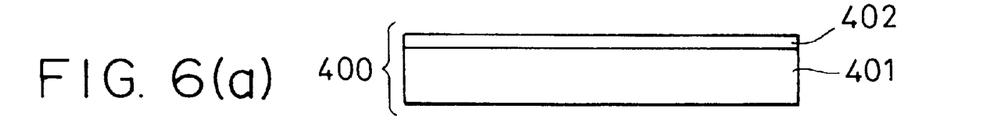
Figure 6B:
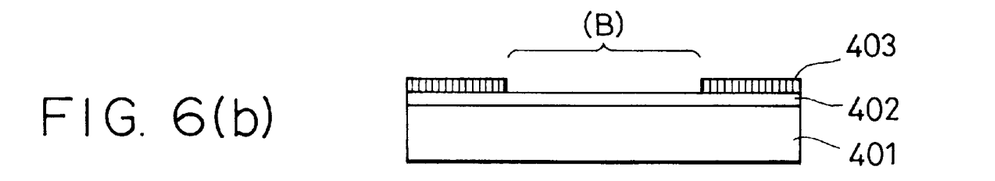
Figure 6C:
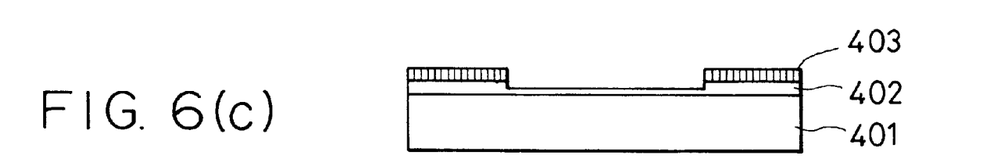
Figure 6D:
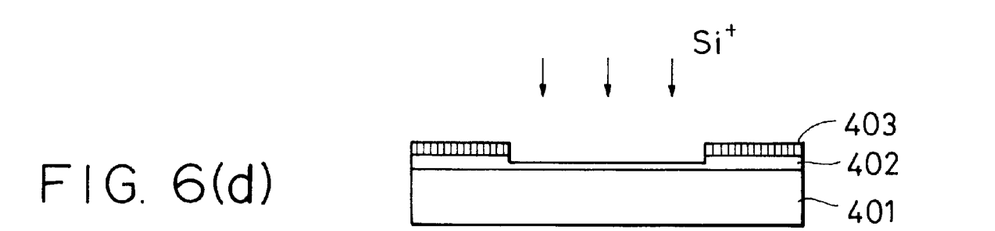
Figure 6E:
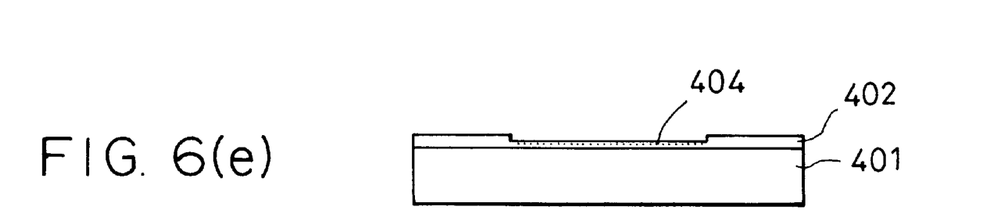

Thereafter, aluminium was deposited as an electrode material according to a sputtering process, and was worked into a predetermined configuration of wiring according to a dry etching process, whereby wiring 315 was formed (FIG. 5(*a*)).

Pixel electrodes and the like were formed by use of Indium Tin Oxide (ITO) according to a conventional process and were completely covered with a transparent insulating film 316 including an alignment film according to a typical technique, thus constructing an active matrix substrate. The transparent insulating film 316 may be constructed to have an opening by means of etching so that the pixel electrodes may be completely or partially uncovered.

Subsequent to the formation of a transparent electrode on a glass substrate 319 according to a typical process, an alignment film 340 and the like were formed, thus preparing an opposing substrate. Then, the active matrix substrate and the opposing substrate were located to opposedly face each other via a sealing material 317, and a liquid crystal material 318 was sealed between the active matrix substrate and the opposing substrate (FIG. 5(*b*)). Then, a polarizer (not shown) was placed on the exterior of each substrate. In the manner described above, a liquid crystal display was manufactured. High definition-compatible image signals were input into this liquid crystal display, which then stably produced excellent images on the display.

In the active matrix liquid crystal display constructed in this embodiment, the pixel switches corresponding to the TFTs that would be subjected to the largest voltage are constructed of polycrystal silicon TFTS, thereby solving the problem of resistance to voltages inherent in TFTs and also the problem of a leakage current caused by the entry of light to the pixel switch TFTs. Moreover, the peripheral circuit, in particular, the shift register, was constructed of a single crystal silicon TFT, thus making it possible to deal with signals having very high frequencies, for example, high-definition television-compatible signals.

EXAMPLE 2

In this embodiment, an active matrix substrate was produced in a manner similar to Example 1, except that the amount of $Si^+$ ion implanted into the substrate 200 was changed (from $5\times10^{15}/cm^2$) to $5\times10^{14}/cm^2$. Two specimens produced under the above-described conditions were prepared. The ion-implanted region of one specimen underwent what was referred to as SECCO etching, and the amount of defects was measured. It was then confirmed that the region constructed in the single crystal structure had a defect in the amount of approximately $10^{11}/cm^2$. Because of this, an active matrix substrate was produced by use of the other specimen, and an opposing substrate was also prepared in a manner similar to Example 1. Thereafter, a liquid crystal display was manufactured in a manner similar to the first embodiment.

As in Example 1, an image display test was performed on the thus-produced liquid crystal display. It was confirmed that this display also stably produced excellent images.

EXAMPLE 3

In this embodiment, a liquid crystal display was produced by forming an active matrix substrate according to a process schematically shown in FIG. 6, wherein a single crystal silicon layer 402 was first formed on a quartz substrate 401 according to a typical laminating and etching technique, whereby an insulating (SOI) substrate 400 was constructed (FIG. 6(*a*)).

The thickness of the single crystal silicon layer 402 was controlled to be 4000 Å by means of polishing. A resist 403 was applied to the single crystal silicon layer 1102 formed on the substrate 400 and was partially removed by means of patterning so as to provide an opening for a region (B) to be formed into a non-single crystal structure (FIG. 6(*b*)). The substrate 400 was installed in a dry etching apparatus in which the thickness of the single crystal silicon layer 402 without having a resist 403 thereon was reduced to be approximately 1000 Å or smaller to be formed into a thin film (FIG. 6(*c*)). Then, the substrate 400 was installed in an ion implantation apparatus, and Si$^+$ ions in the amount of $1 \times 10^{15}/cm^2$ were implanted in and around the above-described opening at an acceleration energy of 40 KeV (FIG. 6(*d*)) to transform the single crystal silicon layer into amorphous silicon layer 404.

Thereafter, subsequent to the removal of the resist for forming the opening (FIG. 6(*e*)), the resulting substrate 400 may undergo an annealing process, in which case, the amorphous silicon may be transformed into polycrystal silicon. Further, annealing conditions are changed so that the grain size of the polycrystal silicon can be controlled. According to this process, the single crystal silicon layer, and the non-single crystal silicon layer having a smaller thickness than the single crystal silicon layer, were formed on the same substrate. An active matrix substrate was formed by use of the above substrate according to a technique similar to Example 1. Then, an opposing substrate was prepared, and a liquid crystal display was manufactured in a manner similar to Example 1. An image display test was performed on the thus-produced liquid crystal display. It was then confirmed that the liquid crystal display stably produced excellent images. In particular, the liquid crystal display in this embodiment was constructed in such a manner that the thickness of the non-single crystal silicon layer was formed smaller than the thickness of the surrounding single crystal silicon layer. Because of this construction, any adverse influence of a leakage current on TFTs serving as the pixels was significantly reduced to such a degree as to be unnoticeable.

EXAMPLE 4

In this embodiment, a liquid crystal display was produced by forming an active matrix substrate according to a process schematically shown in FIG. 7, wherein a single crystal silicon layer 503 was formed on a quartz substrate 501 according to a typical laminating technique so as to construct an insulating (SOI) substrate 500 (FIG. 7(*a*)). The thickness of the single crystal silicon layer 503 was 4000 Å. A silicon nitride layer 520 was deposited on the single crystal silicon layer 503 of the insulating substrate 500 according to a reduced-pressure CVD process, and was partially removed by means of dry etching so as to provide an opening for a region (B) to be formed into a non-single crystal structure (FIG. 7(*b*)).

Figure 7A:
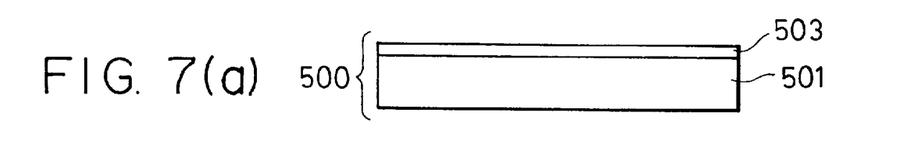
Figure 7B:
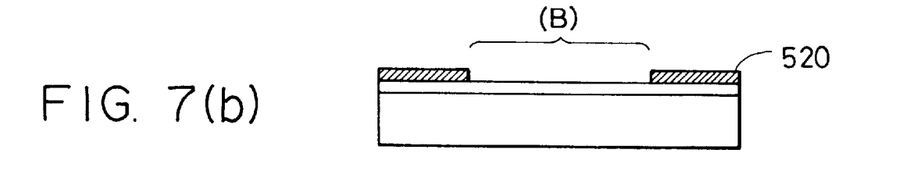
Figure 7C:
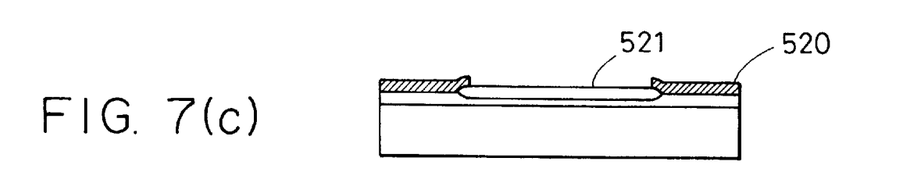
Figure 7D:
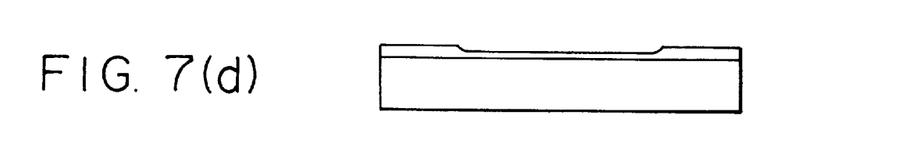

Subsequently, the substrate 500 was installed in an oxidizing apparatus, and the single crystal silicon layer 503 without having the silicon nitride layer 520 was oxidized so that the thickness of the silicon layer 503 would be approximately 1000 Å or smaller. A silicon oxide layer 521 was thus formed (FIG. 7(*c*)). The silicon oxide layer 521 was then removed by means of wet etching to obtain a single crystal silicon layer having a thickness of 1000 Å or smaller (FIG. 7(*d*)).

Figure 7E:
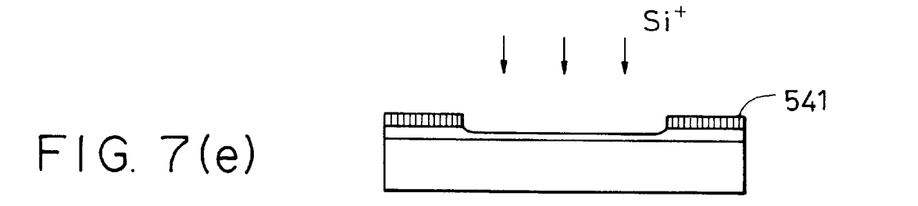
Figure 7F:
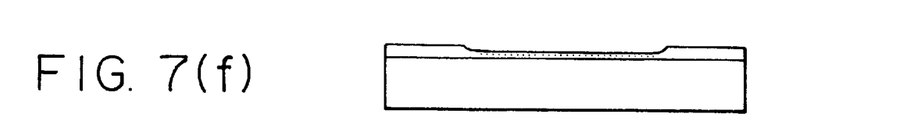
Figure 8A:
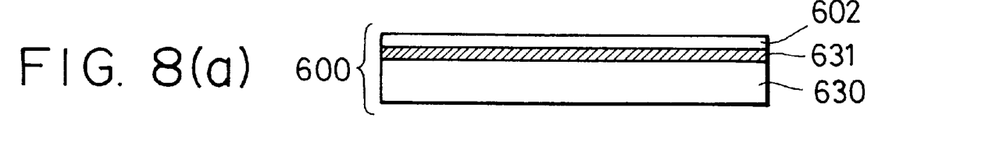
Figure 8B:
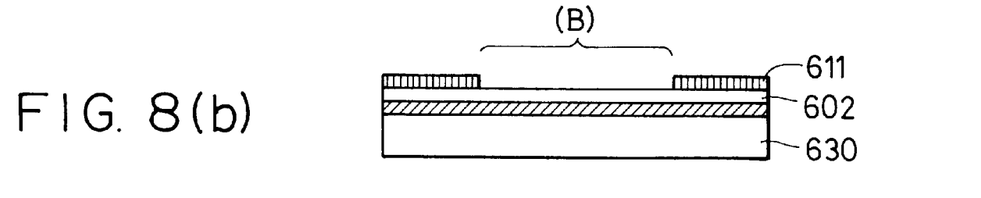
Figure 8C:
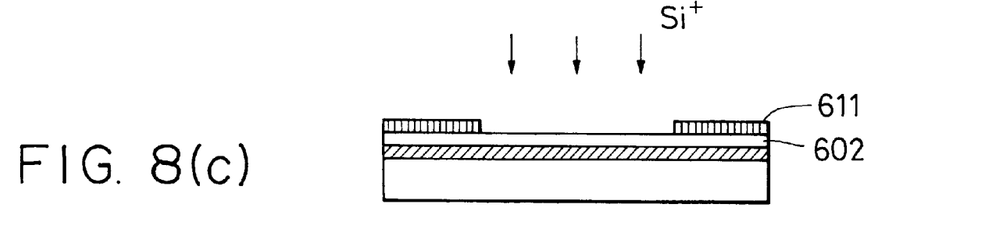
Figure 8D:
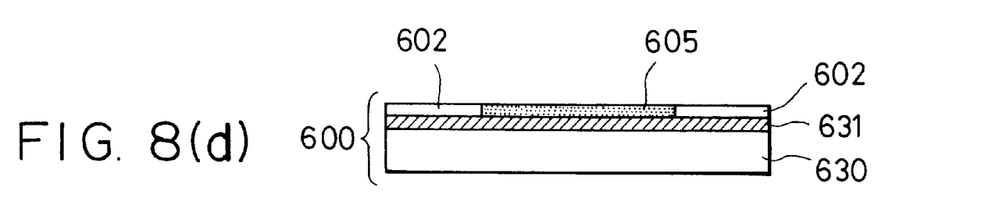
Figure 8E:
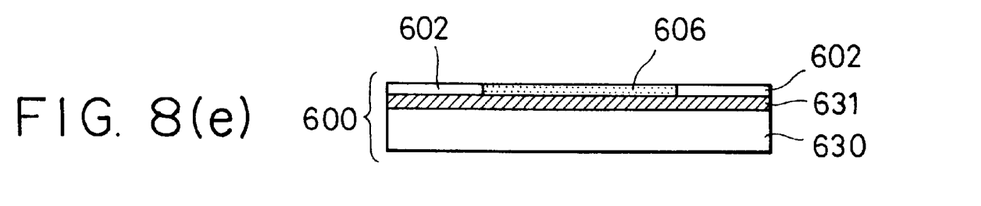

A resist 541 was applied to the single crystal silicon layer 503 and was partially removed to provide an opening for a region (B) to be formed into a non-single crystal structure. The thus-formed substrate 500 was installed in an ion-implantation apparatus in which Si$^+$ ions in the amount of $10^{15}/cm^2$ were implanted in and around the above-described opening at an acceleration energy of 40 KeV (FIG. 7(*e*)). Due to this ion implantation, the single crystal silicon layer 503 without having the resist 541 thereon was amorphized. Then, the resist 541 was removed. Thin film transistors and the like were formed into the thus-produced substrate (FIG. 7(*f*)), thus constructing an active matrix substrate. A liquid crystal display was manufactured by use of this active matrix substrate and an opposing substrate obtained in a manner similar to Example 1. An image display test was carried out on the liquid crystal display, which then stably produced excellent images.

EXAMPLE 5

Figure 9A:
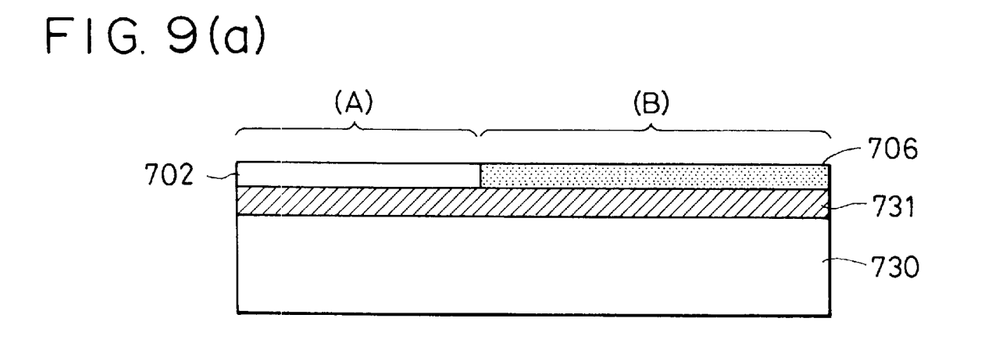
Figure 9B:
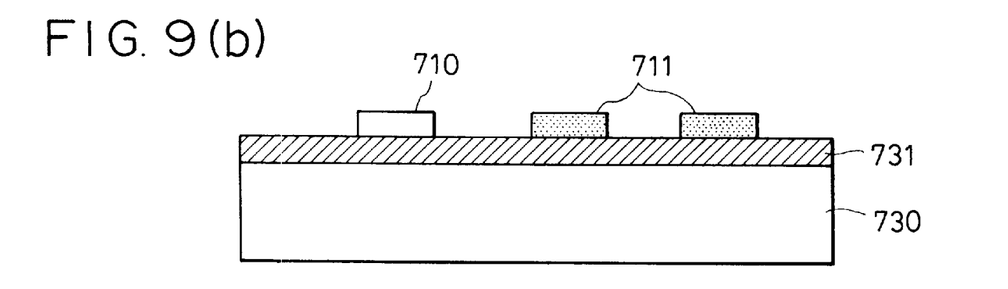
Figure 9C:
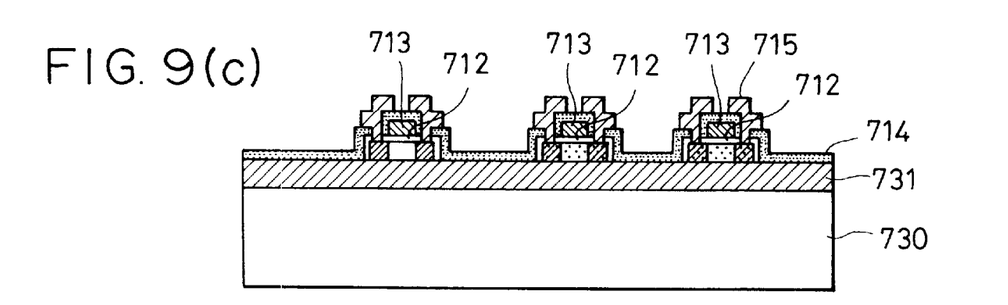
Figure 10A:
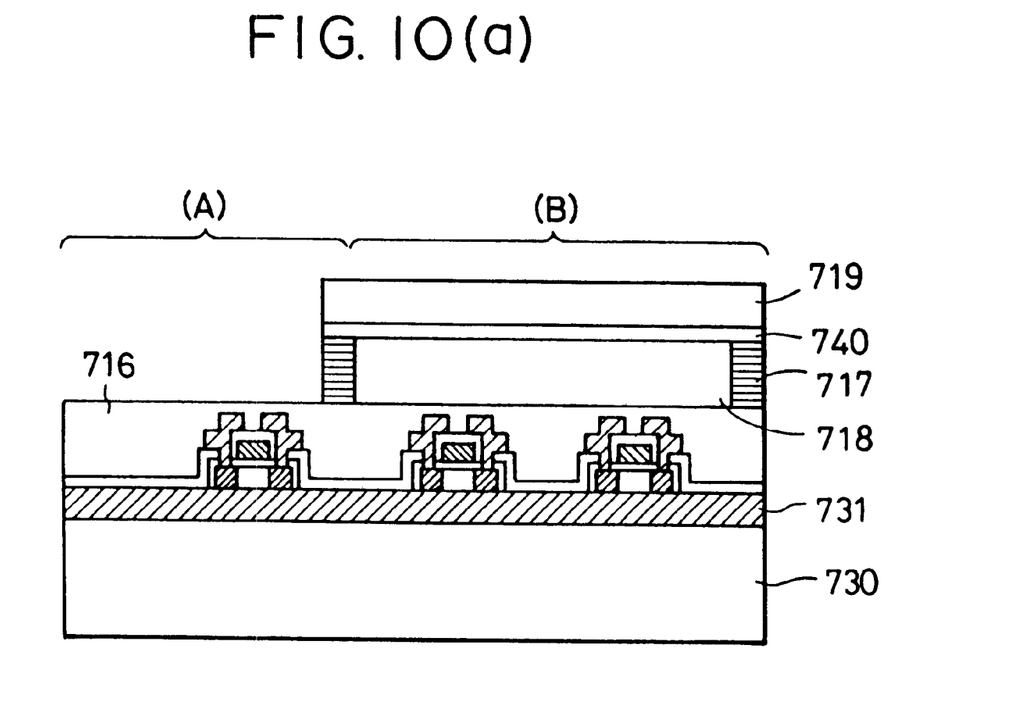
Figure 10B:
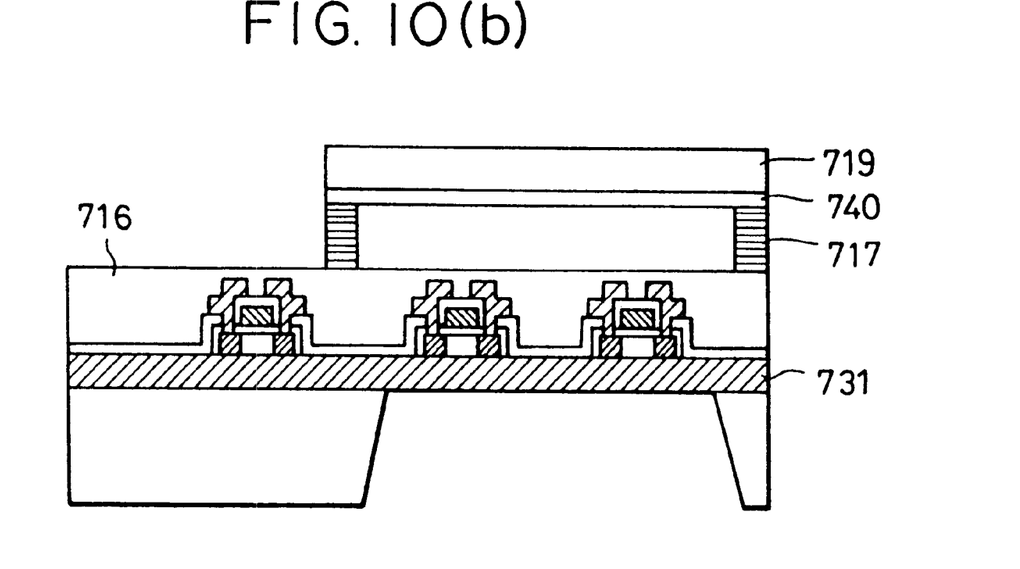

This embodiment will now be explained with reference to FIGS. 8 to 10. In this embodiment, an active matrix circuit substrate was formed by use of an insulating substrate provided with an opaque single crystal silicon layer disposed thereon and a liquid crystal display was manufactured by use of this active matrix circuit substrate. The manufacturing method will be described below.

A single crystal silicon layer 602 was formed on an opaque single crystal silicon base 630 via a silicon oxide layer 631 according to a laminating technique, thus constructing an insulating (SOI) substrate 600 (FIG. 8(*a*)).

The thickness of the single crystal silicon layer 602 was 1 $\mu$m or smaller. A resist 611 was applied to the single crystal silicon layer 602 formed on the SOI substrate 600 and was partially removed to provide an opening for a region (B) to be formed into a non-single crystal structure (FIG. 8(*b*)). The substrate 600 was installed in an ion implantation apparatus in which Si$^+$ ions in the amount of $5 \times 10^{15}/cm^2$ were implanted in and around the opening at an acceleration energy of 100 KeV (FIG. 8(*c*)). A region implanted with Si$^+$ ions was thus formed into an amorphous structure (FIG. 8(*d*)) and the substrate 600 was further subjected to an annealing process, whereby the amorphous silicon region 605 was further transformed into a polycrystal silicon region 606 having a grain size of a few thousand Å (FIG. 8(*e*)). An explanation will further be given with reference to FIGS. 9 and 10 of a method of manufacturing a liquid crystal display by use of the thus-prepared substrate. (Referring to FIG. 9(*a*), 706 corresponds to the polycrystal silicon region 606 shown in FIG. 8(*e*). Similarly, 702, 730 and 731 correspond to the single crystal silicon layer 602, the single crystal silicon base 630 and the silicon oxide layer 631, respectively.)

For the formation of a well, boron B in the amount of $4 \times 10^{11}/cm^2$ was implanted into the portion of the single crystal silicon region 702 in which an n-MOS transistor would be formed. On the other hand, phosphorous P in the amount of $2 \times 10^{11}/cm^2$ was implanted into the portion of the single crystal silicon region 702 in which a p-MOS transistor would be formed. Further, phosphorous P in the amount of $1 \times 10^{12}/cm^2$ used as an impurity required for forming a channel was implanted into the polycrystal silicon region 706 (FIG. 9(*a*)).

Subsequently, the single crystal silicon region 702 and the polycrystal silicon region 706 were partially removed by means of dry etching so that only portions of these regions required for forming TFTs (single crystal silicon layer 710 and non-single crystal silicon layers 711) were formed in an isolated and island-like manner (FIG. 9(*b*)). The silicon layers 710 and 711 were then oxidized so that gate insulating films 712 having a thickness of 500 Å were formed. A polycrystal silicon film was deposited on each of the gate insulating films 712 according to a reduced-pressure CVD process so that the thickness of the polycrystal silicon film would be 4000 Å, and as a result, TFT gate electrodes 713 were formed by means of anisotropic etching. For forming a source region and a drain region in a self-matching manner, arsenic (As) ions in the amount of $10^{16}/cm^2$ and $BF_2$ ions in the amount of $2\times10^{15}/cm^2$ were implanted into regions in which n-MOS transistors and p-MOS transistors, respectively, would be formed, according to an ion implantation process.

The process of forming the single crystal silicon layer and the polycrystal silicon layers in an isolated and island-like manner as discussed above may be carried out by use of a technique of separating silicon layers by masking a silicon layer used for TFTs with a silicon nitride layer and by oxidizing the other silicon layer.

A Non-doped Silicate Glass (NSG) layer 714 to serve as a protective layer was deposited on the transistors produced by use of the single crystal silicon layers and the transistors produced by use of the polycrystal silicon layers, according to a normal-pressure CVD process, so that the thickness of the NSG layer 714 would be 5000 Å.

Subsequently, contact holes were provided for part of the NSG layer 714, i.e., on the source and drain regions and on the gate electrodes 713. Thereafter, alminium was deposited as an electrode material according to a sputtering process, and was worked into a predetermined configuration of wiring according to a dry etching process, whereby wiring 715 was formed (FIG. 9(*c*)).

ITO pixel electrodes were formed according to a typical process and were completely covered with a transparent insulating film 716 including an alignment film according to a typical technique, thus forming an active matrix substrate. Subsequent to the formation of a transparent electrode on a glass substrate 719 according to a typical process, an alignment film 740 and the like were formed, thus preparing an opposing substrate. Then, the active matrix substrate and the opposing substrate were located to opposedly face each other via a sealing material 717, and a liquid crystal material 718 was sealed between the active matrix substrate and the opposing substrate (FIG. 10(*a*)).

An opaque substrate 730 was partially removed from the rear surface of a display region by use of an organic alkali, such as KOH, ethylenediamine or the like, according to a wet etching method. The wet etching solution used for etching, does not penetrate or dissolve the silicon oxide layer 731. As a result, the display region became transparent (FIG. 10(*b*)). A polarizer (not shown) was placed on the exterior of each of the substrates and, in the manner described above, a liquid crystal display was manufactured. An image display test was then conducted on the liquid crystal display. As a result, it was then confirmed that the display stably produced excellent images.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a semiconductor device comprising the steps of:

preparing a transparent insulating substrate;

disposing a single crystal semiconductor layer on said insulating substrate;

dividing said single crystal semiconductor layer into a first region forming a first transistor using said single crystal semiconductor layer, and a second region being changed into a non-single crystal semiconductor layer having a defect density higher than that of said first region, said second region forming a second transistor using said non-single crystal semiconductor layer; and forming an active matrix circuit using said second transistor of said second region and forming a drive circuit for said active matrix circuit using said first transistor of said first region.

2. A method of manufacturing a semiconductor device according to claim 1, wherein said second region has non-single crystal semiconductor layer which is an ion-implanted region.

3. A method of manufacturing a semiconductor device according to claim 2, wherein silicon ion is implanted in said ion implanted region.

4. A method of manufacturing a semiconductor device according to claim 2, wherein argon, oxygen or nitrogen ion implanted in said ion implanted region.

5. A method of manufacturing a semiconductor device according to claim 1, wherein the non-single crystal semiconductor layer of said second region is produced by amorphizing said single crystal semiconductor layer disposed on said insulating substrate and annealing crystallization.

6. A method of manufacturing a semiconductor device according to claim 1, wherein said single crystal semiconductor formed on the insulating substrate is single crystal silicon.

7. A method of manufacturing a semiconductor device according to claim 1, wherein said non-single crystal semiconductor is polycrystal silicon.

8. A method of manufacturing a liquid crystal device comprising the steps of:

selecting a semiconductor device according to claim 1;

placing an opposing substrate disposed at a predetermined distance facing the insulating substrate on which said active matrix circuit and said driving circuit are formed; and providing liquid crystal material into a space defined by the opposing substrates.

9. A method of manufacturing a liquid crystal device according to claim 8, wherein said second region has non-single crystal semiconductor layer which is an ion-implanted region.

10. A method of manufacturing a liquid crystal device according to claim 9, wherein silicon ion is implanted in said ion implanted region.

11. A method of manufacturing a liquid crystal device according to claim 9, wherein argon, oxygen or nitrogen ion is implanted in said ion implanted region.

12. A method of manufacturing a liquid crystal device according to claim 8, wherein the non-single crystal semiconductor layer of said second region is produced by amorphizing said single crystal semiconductor layer disposed on said insulating substrate and annealing crystallization.

13. A method of manufacturing a liquid crystal device according to claim 8, wherein said single crystal semiconductor formed on the insulating substrate is single crystal silicon.

14. A method of manufacturing a liquid crystal device according to claim 8, wherein said non-single crystal semiconductor is polycrystal silicon.

* * * * *

UNITED STATES PATENT AND TRADEMARK OFFICE
CERTIFICATE OF CORRECTION

PATENT NO.   : 6,157,421
DATED        : December 5, 2000
INVENTOR(S)  : Takayuki Ishii It is certified that error appears in the above-identified patent and that said Letters Patent is hereby corrected as shown below:

Title page,
Insert: -- [*] Notice:   This patent issued on a continued prosecution application filed under 37 CFR 1.53(d), and is subject to the twenty year patent term provisions of 35 U.S.C. 154(a)(2). --.

Column 4,
Line 9, "semiconductor :region" should read -- semiconductor region --.

Column 5,
Line 33, "crystal." should read -- crystal --.

Column 9,
Line 1, "layer 1102" should read -- layer 402 --.

Column 12,
Line 20, "ion implanted" should read -- ion-implanted --;
Line 22, "ion" should read -- ion is --;
Line 23, 50 and 53, "ion implanted" should read -- ion-implanted --.

Signed and Sealed this

Thirteenth Day of November, 2001

Attest:

NICHOLAS P. GODICI
Attesting Officer    Acting Director of the United States Patent and Trademark Office